United States Patent

Hua

[11] Patent Number: 5,960,863
[45] Date of Patent: Oct. 5, 1999

[54] DISSIPATING DEVICE FOR COMPUTER CHIPS

[76] Inventor: Hsu Mei Hua, No. 7, Lane 49, Kuang-Hui Rd., Wen-Shan Dist., Taipei, Taiwan

[21] Appl. No.: 09/004,029

[22] Filed: Jan. 7, 1998

[51] Int. Cl.⁶ .................................................. F28F 3/02
[52] U.S. Cl. ........................ 165/80.3; 165/185; 165/907
[58] Field of Search ................................. 165/80.3, 185, 165/907

[56] References Cited

U.S. PATENT DOCUMENTS

| | | | |
|---|---|---|---|
| 2,930,208 | 3/1960 | Lyman | 165/171 X |
| 4,130,233 | 12/1978 | Chisholm | 228/126 |
| 4,304,738 | 12/1981 | Nutter | 261/94 |
| 4,359,181 | 11/1982 | Chisholm | 165/907 X |
| 4,540,045 | 9/1985 | Molitor | 165/164 |
| 4,981,172 | 1/1991 | Haerle | 165/133 |
| 5,180,001 | 1/1993 | Okada et al. | 165/80.4 |
| 5,607,778 | 3/1997 | Padden | 428/613 |

*Primary Examiner*—Allen Flanigan
*Attorney, Agent, or Firm*—Rosenberg, Klein & Bilker

[57] ABSTRACT

The present invention relates to a dissipating device that uses a high-efficiency radiator for natural convection heat dissipation for a CPU (central processing unit) or an IC (integrated circuit) die with low cost. The radiator is formed by screen plates punched to form many tilted rhombus cells constructed by many wave-shaped mesh wires having a flat rectangular cross-section. The screen plates are made of good heat-conductive metal material. A plurality of the screen plates are overlapped in various orientations so that the heat dissipating effect can be improved, radiating heat through natural convection.

1 Claim, 7 Drawing Sheets

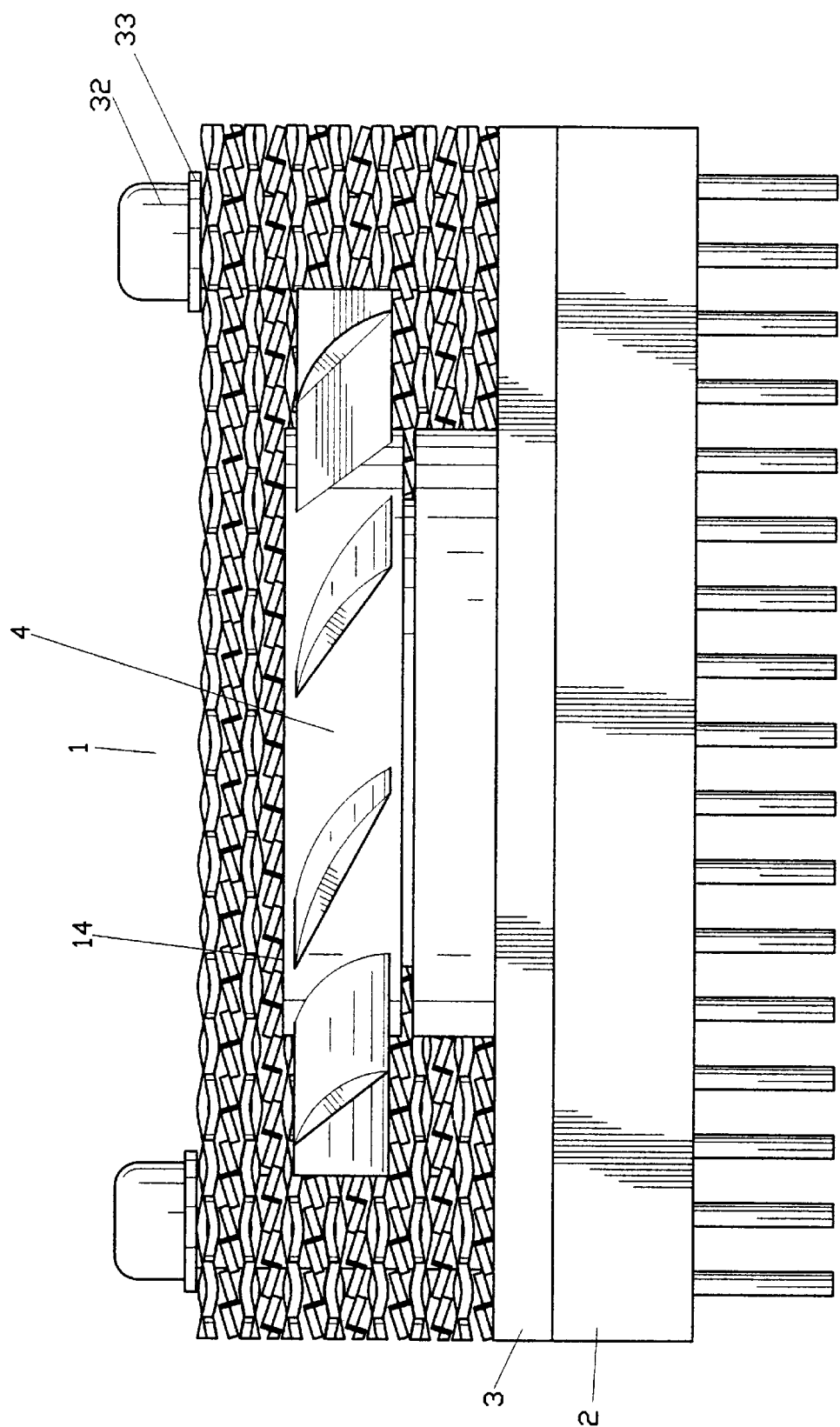

DISSIPATING DEVICE FOR COMPUTER CHIPS

BACKGROUND OF THE INVENTION

1. Field of the Invention

The present invention relates to a dissipating device, and more particularly to a dissipating device that is used to build a high efficiency radiator for dissipation by natural convection for cooling a CPU (central processing unit) or an IC (integrated circuit) die at low cost.

2. Prior Art

For keeping a CPU or an IC working in a normal temperature range, a radiator is attached thereto. In accordance with the methods of removing heat from a CPU or an IC while it is working, one of two ways is used. One method uses a forced draft cooling system, and the other is the use of convection. The conventional radiators have the following types:

1. a dissipating block and gum for increasing the thermal radiating area. The dissipating block is made with several ribs or vertical needles, with a material of high thermal conductivity, and adhered on the surface of a CPU or an IC die with gum to radiate the heat emitted from the CPU or the IC die to the air;

2. a cooling fan attaching on the surface of a CPU, or cooperating with above-mentioned dissipating block to combine a forced draft cooling radiator to direct a flow of air; and, 3. a heat pipe coupled to the surface of a CPU, the heat of the CPU is removed.

With regard to use of a cooling fan, a power supply is needed, vibration and noise are generated as it runs, and it increases the power supply load, especially if many cells operate at the same time. The dissipating effect of the dissipating block and gum or the heat pipe is limited, especially without the cooperation of other dissipating devices, so the heat dissipation efficiency is not high enough. On the other hand, the dissipating block is made of an inferior aluminium (Al) extracted from waste metals, and the surfaces of it should be treated by an anti-corrosion process with a chromate treatment, which bears some toxins that will be harmful to humans when heated. Additionally, the molded aluminium bar should be cut into the plates by a high-pressure water cutter, and finished with an anodize finish for increasing the corrosion resistance and dissipating effect. For obtaining a better dissipating effect, a bigger area of the cutting surface (facing to the air) is provided, and the longer the cutting time is increased. The whole block would thereby be heavier, so the production cost is increased. Additionally, the above-mentioned two types of anti-corrosion treatment for aluminium dissipating blocks may cause pollution to the environment.

SUMMARY OF THE INVENTION

It is therefore a main object of the present invention to provide a combined dissipating device with guiding channels, which is light in weight, saving material, easy to manufacture and lower in cost.

The object is achieved by a dissipating block consisting of several overlapping or staggered overlapping screen plates, which are punched into many tilted rhombus meshes constructed by many wave-shaped mesh wires having a flat rectangle section in lapping connection. The screen plate is made of good heat-conductive metal material. Cooperating with a wide variety of lapping arrangement of the screen plates, the heat dissipating effect can be improved to radiate heat in a natural convection dissipation condition.

BRIEF DESCRIPTION OF THE DRAWINGS

FIG. 7 is a side view showing a version of the present invention incorporating a cooling fan.

DETAILED DESCRIPTION OF THE PREFERRED EMBODIMENTS

Figure 1:
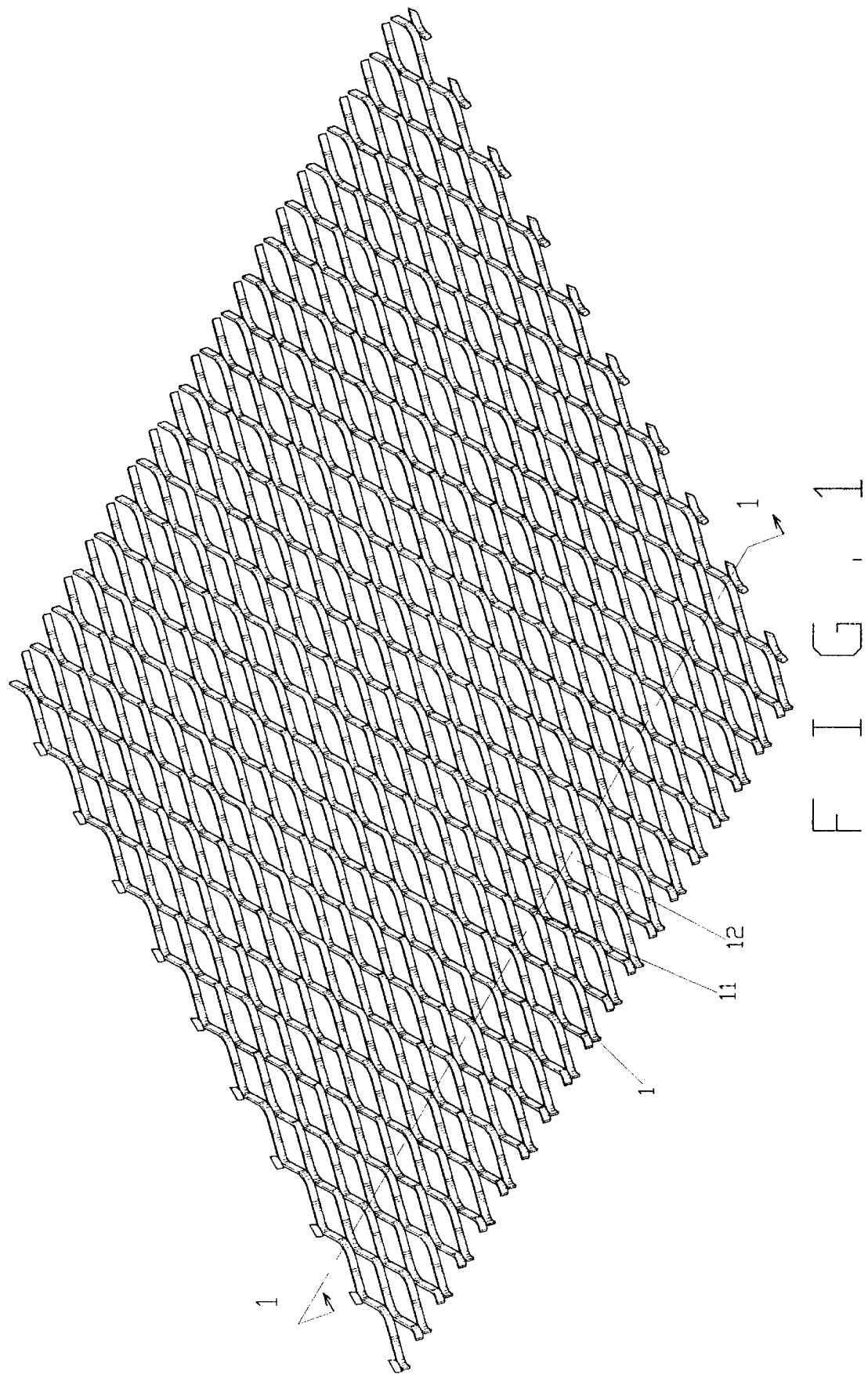
FIG. 1 is a perspective view showing the structure of the screen plate of the present invention.
Figure 2:
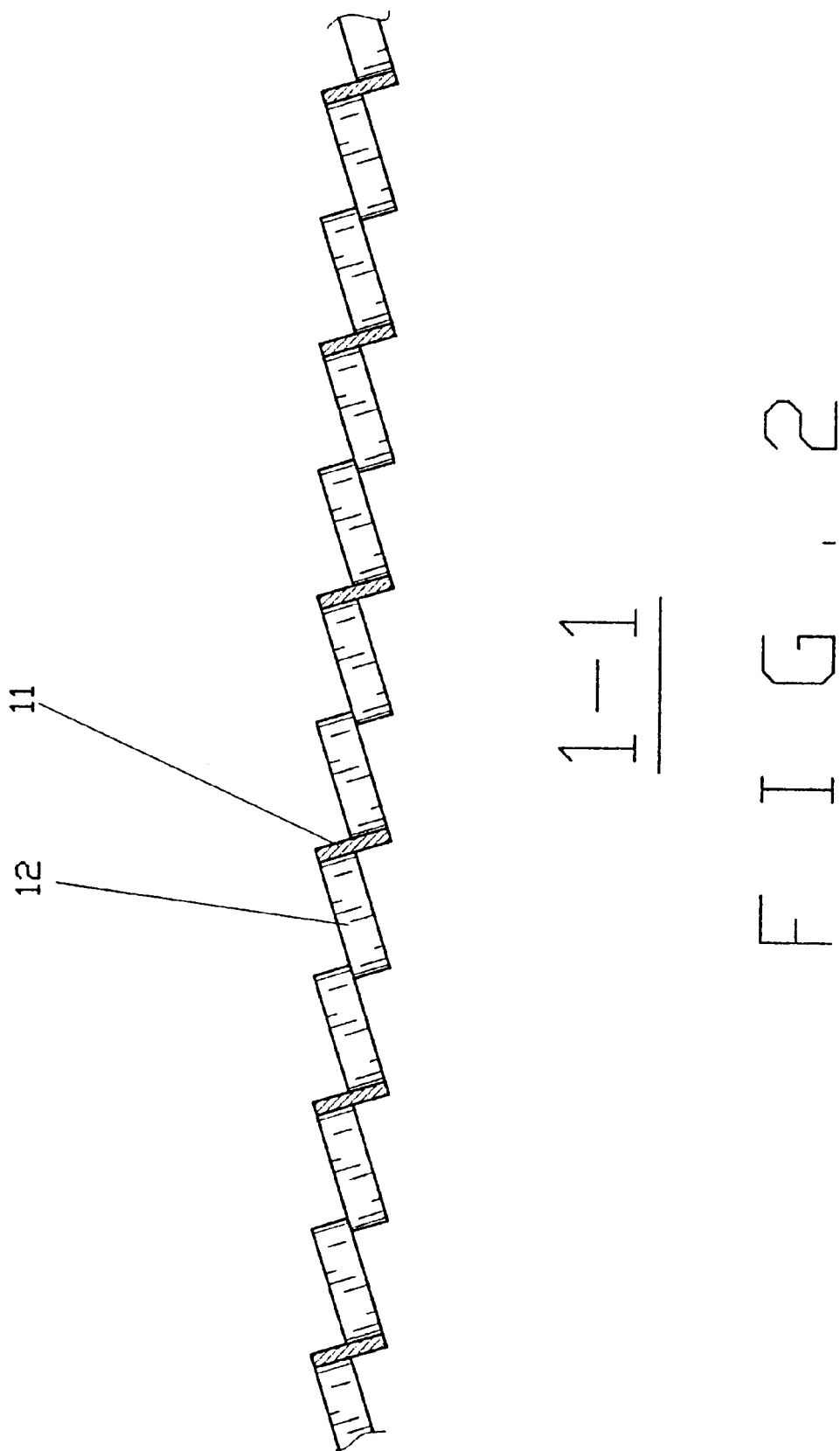
FIG. 2 is a section view showing the screen plate of the present invention.

Referring to FIG. 1 and FIG. 2, the present invention consists of several screen plates 1, which are punched and stretched into many tilted rhombus cells 12 constructed by many wave-shaped mesh wires 11. The mesh wires 11 have a flat cross-section connected together longitudinally and transversely, the wave-shaped mesh wires 11 are angularly directed, and connected to adjacent wave-shaped mesh wires 11. Between the connectors, the mesh wire sections are inclined at an angle to extend from a bottom surface of one adjacent mesh wire 11 to an upper surface of another adjacent mesh wire 11 to form each screen plate 1. The screen plates 1 can be cut to a desired size.

Figure 3:
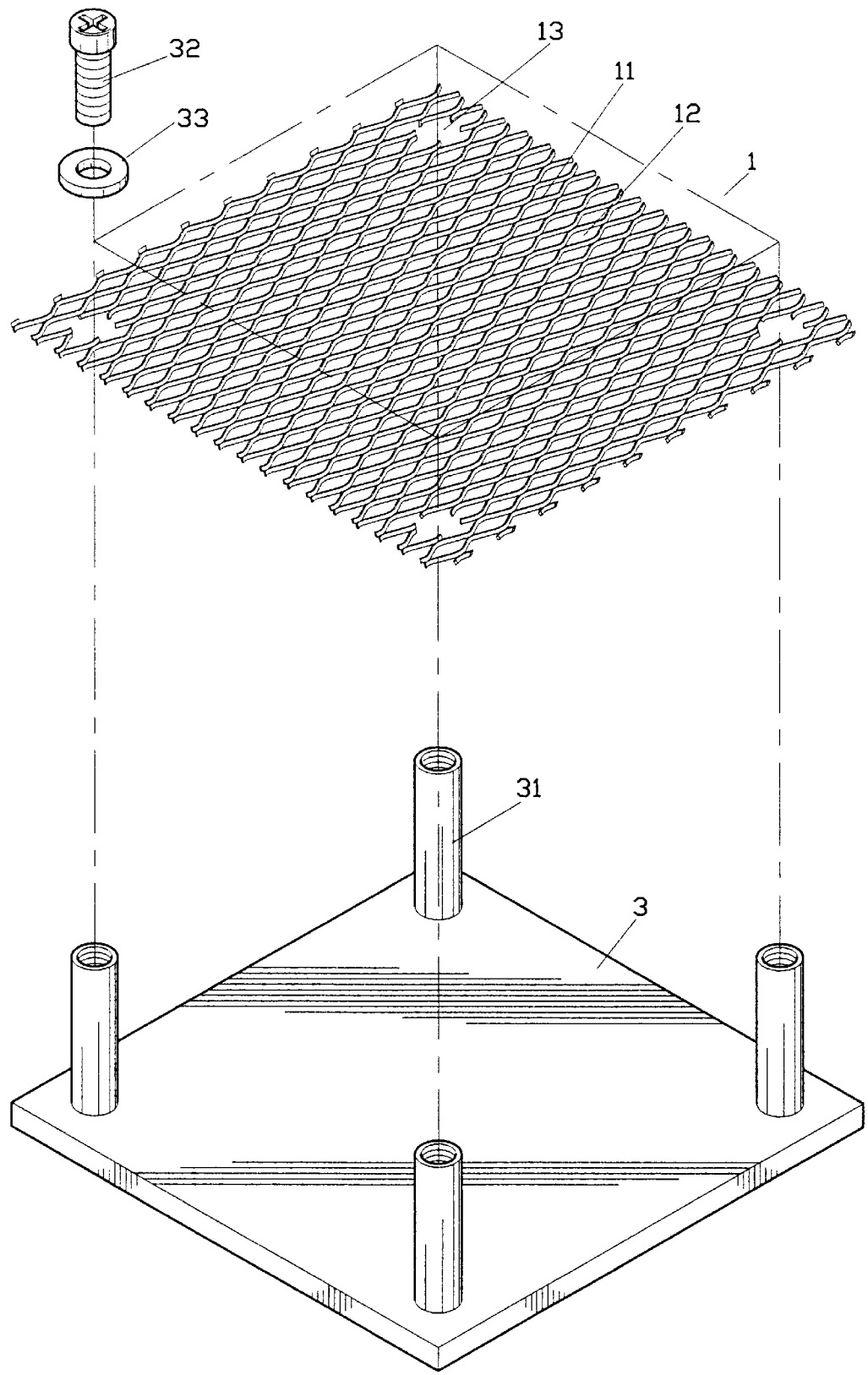
FIG. 3 is an exploded view of the present invention.
Figure 4:
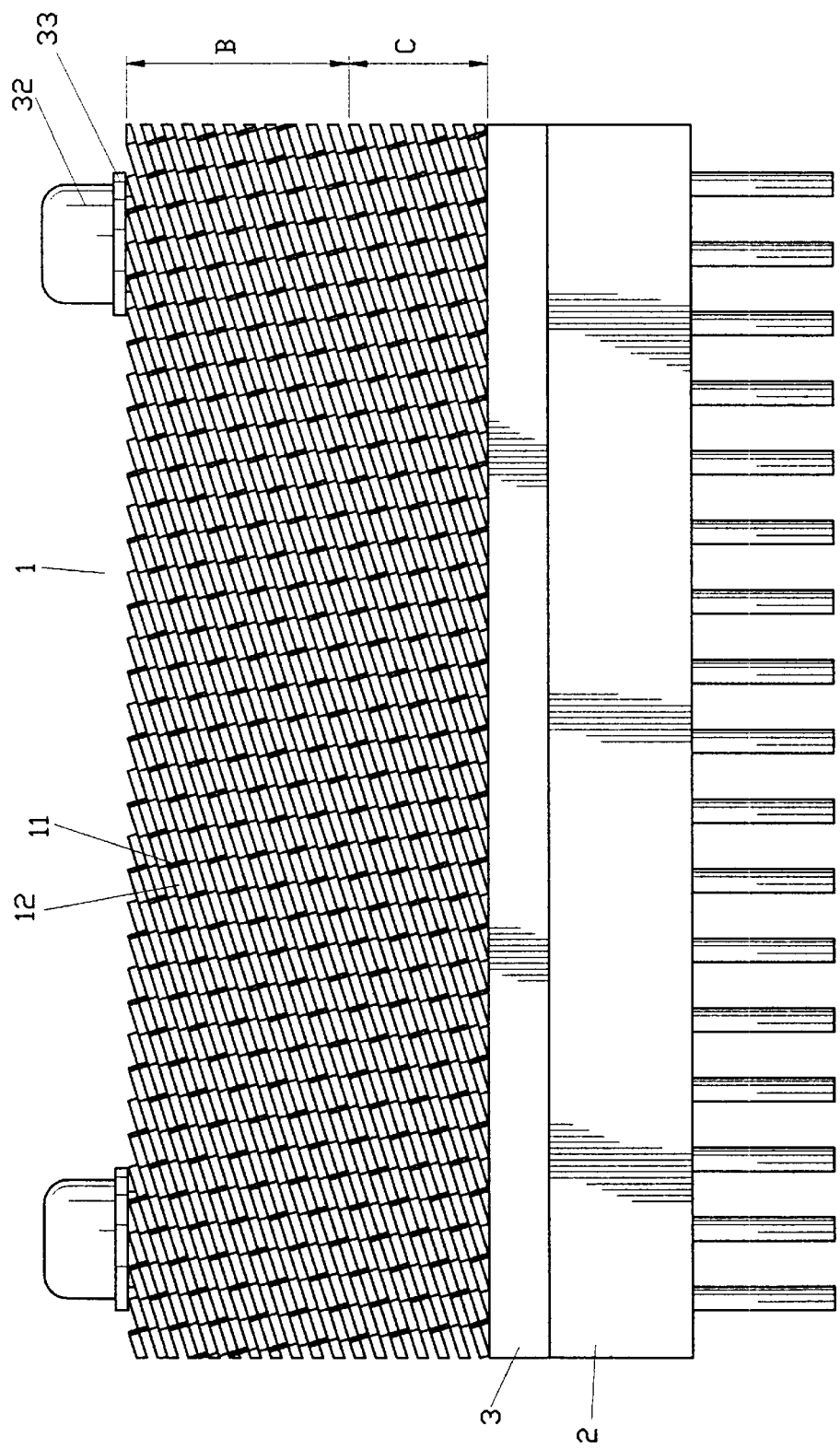
FIG. 4 is a side view showing the first embodiment of the present invention.
Figure 5:
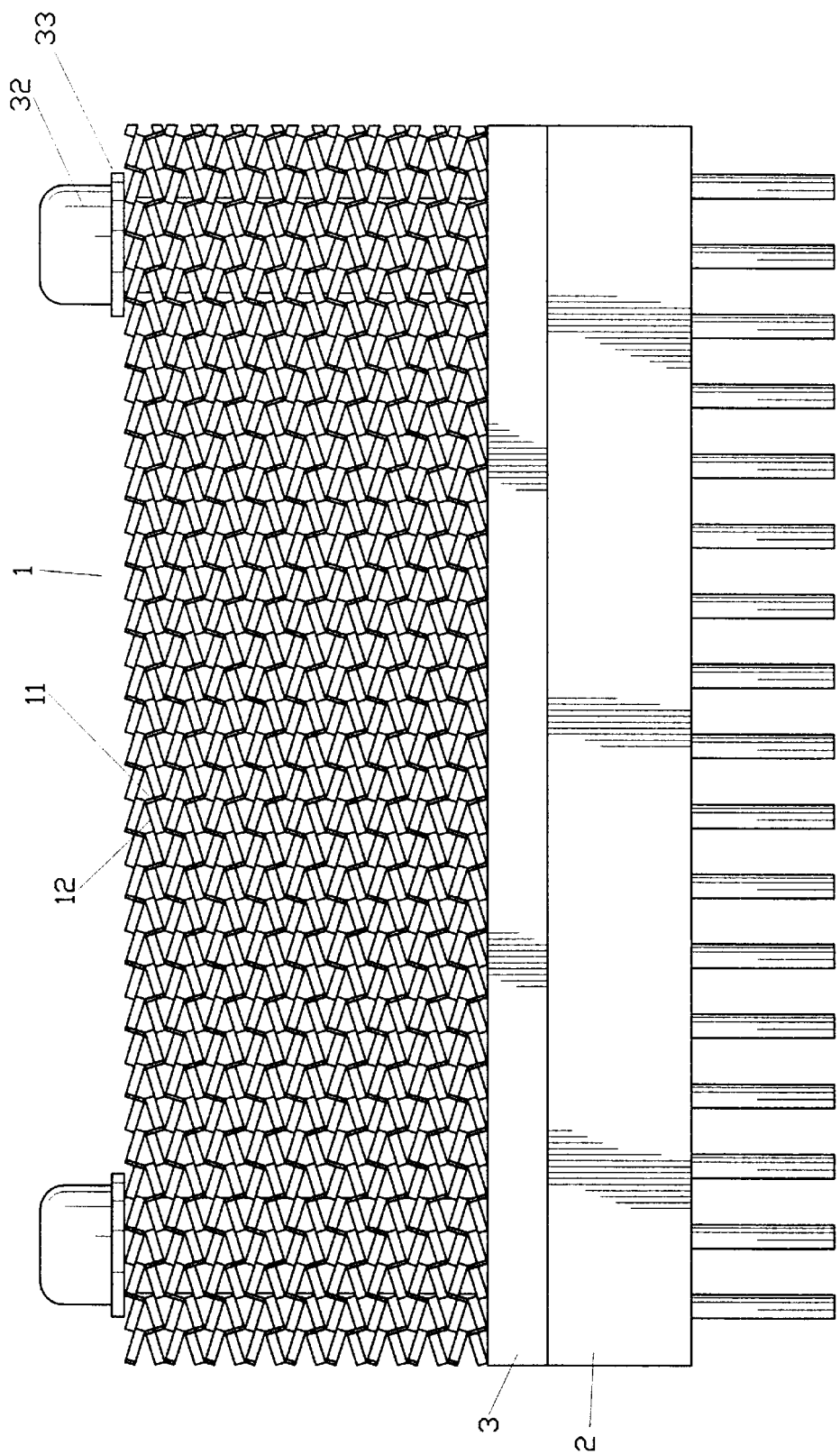
FIG. 5 is a side view showing the second embodiment of the present invention.

When building a radiator for attachment on an IC die or a CPU, as shown in FIG. 3, a plurality of screen plates 1 of proper size are overlapped one upon another, and fastened on a base plate 3 made of a high thermally conductive material. Four upright poles 31 are built on the corners of the base plate 3 with four holes 13 formed in the corners of each screen plate 1 and secured with bolts 32 and washers 33. The base plate 3 is then stuck on the top surface of the integrated circuit (IC) 2 by a heat conductive gum, as shown in FIG. 4 and FIG. 5. Fastening of the plurality of screen plates 1 on the base plate 3 can employ other methods, such as by elastic clamps or attachment of a screen cover (not shown in drawings). Referring to FIG. 4, the contacting surface of the base plate 3 absorbs the heat emitted from the IC 2. By means of a high-thermally conductive spacer, the heat on the base plate 3 is conducted to the screen plates 1 near a bottom section of stacked screens 1 (marked as C in FIG. 4). In that section, the face-contacting area between the adjacent screen plates 1 can be controlled by changing the mesh pitch and the mesh diameter so as to get an 80–85% contacting area. Above the C section, the screen plates 1 define a radiating portion (marked as B in FIG. 4), in which the face-conducting area occupies 20%, and the point-conducting area is 80% to provide enough gaps for air flow to radiate heat. The screen plates 1 may be formed from copper, aluminium, tin, nickel or an alloy thereof. If the screen plate 1 is made of copper (Cu), the overlapped screen plates 1 can be soaked in a solder tinning tank so that the contacting points are soldered together to fix the screen plates 1 integrally, to increase the heat-conductivity thereof. Further, when various screen plates are overlapped, a spot welding method may be applied to the connecting points of each screen plate 1.

For controlling the dissipating rate of the conducting area, the orientation of tilted rhombus cells 12, as the screen plates 1 are overlapped, can be taken as follows. When the orientation of the tilted rhombus cells 12 of all of the screen plates 1 are arranged in the same direction, as shown in FIG. 4, the mesh wire 11 of the upper screen plate 1 touches the screen plate 1 disposed below with the mesh wire 11 forming an oblique lapping arrangement. In that arrangement, the tilted rhombus cells 12 of the screen plates 1 form rows of slanting open channels holes defined by the overlapped tilted rhombus cells 12, for leading out most of the heat by means of air flow therein, and the remaining heat is dissipated from the sides and top portion of the overlapped screens. On the other hand, gaps between each of the screen plate 1 layers are of great assistance in dissipating heat with flowing air, reducing the remaining heat between the layers. Additionally, due to the uniformity of the position of the tilted rhombus cells 12, the adjacent screen plates 1 can be overlapped in opposite directions so that the tilted rhombus cells 12 face in opposite directions, respectively, as shown in FIG. 5, in order to dissipate the heat away from both sides.

Figure 6:
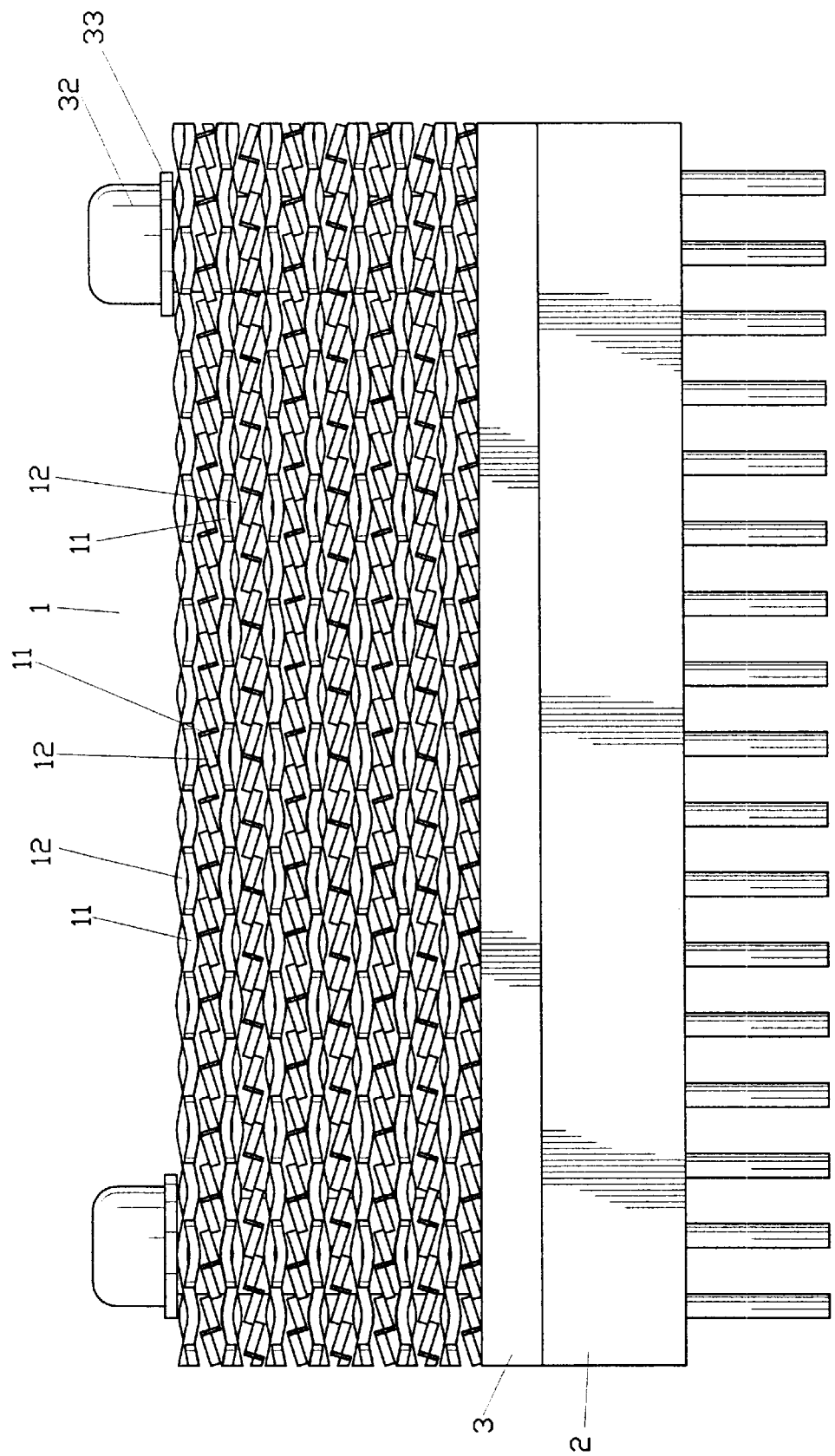
FIG. 6 is a side view showing the third embodiment of the present invention.

As shown in FIG. 6, the arrangement of the screen plates 1 can be arranged in other configurations. The tilted rhombus cells 12 can be arranged to angularly rotate one with respect to another, for example, in a clockwise direction. The first piece faces a direction corresponding to three o'clock, the second faces six o'clock, the third nine o'clock, and the fourth corresponds to twelve o'clock, the included angle between adjacent pieces 1 being 90 degrees. The screen plates 1 are overlapped together to construct a complicated staggered mesh screen with larger transverse gaps between the lapping layers to eliminate heat remaining between them. According to the desired scale of dissipation efficiency, the arrangement of overlapping the screen plate can be varied many ways, without the limitation.

For improving the heat dissipation efficiency, as shown in FIG. 7, a housing 14 is built at the center of the overlapped screen plates 1 for setting a cooling fan 4 therein to force the flow of air to dissipate the heat and obtain a greater heat dissipation efficiency.

In addition to providing heat dissipation for an IC die and a CPU, the present invention can be used for dissipating heat of other heat generating devices.

I claim:

1. A heat dissipation device, comprising:

a base plate having upper and lower planar surfaces, said lower surface being thermally coupled to a heat dissipating device; and, a plurality of screen plates disposed in overlaying relationship and secured to said base plate, each of said screen plates being formed by a plurality of intersecting wave-shaped wires having a rectangular cross-sectional contour, said wave-shaped wires having interconnection portions to define a plurality of tilted closed contour rhombus shaped cells therebetween, each of said rhombus shaped cells being substantially aligned with a rhombus shaped cell formed on a next succeeding screen plate, each of said wave-shaped wires having a plurality of inclined sections extending between respective pairs of said interconnecting portions, said inclined sections extending from a bottom surface of one wave-shaped wire to an upper surface of a respective other wave-shaped wire, each of said inclined section upper surfaces extending in a plane coincident with a plane of a next consecutive inclined section lower surface to thereby form non-planar top and bottom surfaces of each of said screen plates whereby heat is dissipated by (1) conduction through contact of one of said screen plates with a next succeeding screen plate, and (2) convection through said aligned rhombus shaped cells.

\* \* \* \* \*